United States Patent
Lin

(10) Patent No.: US 11,071,208 B2
(45) Date of Patent: Jul. 20, 2021

(54) CIRCUIT BOARD COMPONENT LAYOUT DETERMINATION METHOD

(71) Applicant: PORTWELL INC., New Taipei (TW)

(72) Inventor: Shih Yao Lin, New Taipei (TW)

(73) Assignee: PORTWELL INC., New Taipei (TW)

( * ) Notice: Subject to any disclaimer, the term of this patent is extended or adjusted under 35 U.S.C. 154(b) by 339 days.

(21) Appl. No.: 15/986,610

(22) Filed: May 22, 2018

(65) Prior Publication Data

US 2018/0343746 A1 Nov. 29, 2018

(30) Foreign Application Priority Data

May 26, 2017 (TW) .................................. 106117591

(51) Int. Cl.
*H05K 3/00* (2006.01)
*H05K 3/30* (2006.01)
*G06F 30/39* (2020.01)
*G06F 30/398* (2020.01)

(52) U.S. Cl.
CPC ........... *H05K 3/0005* (2013.01); *G06F 30/39* (2020.01); *G06F 30/398* (2020.01); *H05K 3/30* (2013.01)

(58) Field of Classification Search
CPC ........ H05K 3/0005; G06F 3/392; G06F 3/398
See application file for complete search history.

(56) References Cited

U.S. PATENT DOCUMENTS

| 4,630,219 A * | 12/1986 | DiGiacomo | G06F 30/392 716/123 |
| 5,187,668 A * | 2/1993 | Okude | G06F 30/392 716/123 |
| 6,385,758 B1 * | 5/2002 | Kikuchi | G06F 30/398 716/122 |
| 2005/0055828 A1 | 3/2005 | Wang et al. | |
| 2013/0174111 A1 * | 7/2013 | Durkan | G06F 30/398 716/112 |

* cited by examiner

*Primary Examiner* — Livius R. Cazan
(74) *Attorney, Agent, or Firm* — Muncy, Geissler, Olds and Lowe, P.C.

(57) ABSTRACT

A circuit board component layout determination method includes the steps of: (1) simulating the placement of components by a circuit board layout software program; (2) performing a circuit board component layout density analysis to obtain a circuit board component layout density percentage; (3) determining whether or not the simulated placement of components is feasible according to the circuit board component layout density percentage, and if yes, carrying out step (4); and (4) placing the components into the circuit board. The method uses a circuit board layout software program and a spreadsheet or a database to calculate the statistics of an area of a circuit board that can be laid and an area of the circuit board that cannot be laid, so as to analyze and determine the implementability of a component layout, and improve the control, efficiency and cost-effective of the component layout of the circuit board.

9 Claims, 1 Drawing Sheet

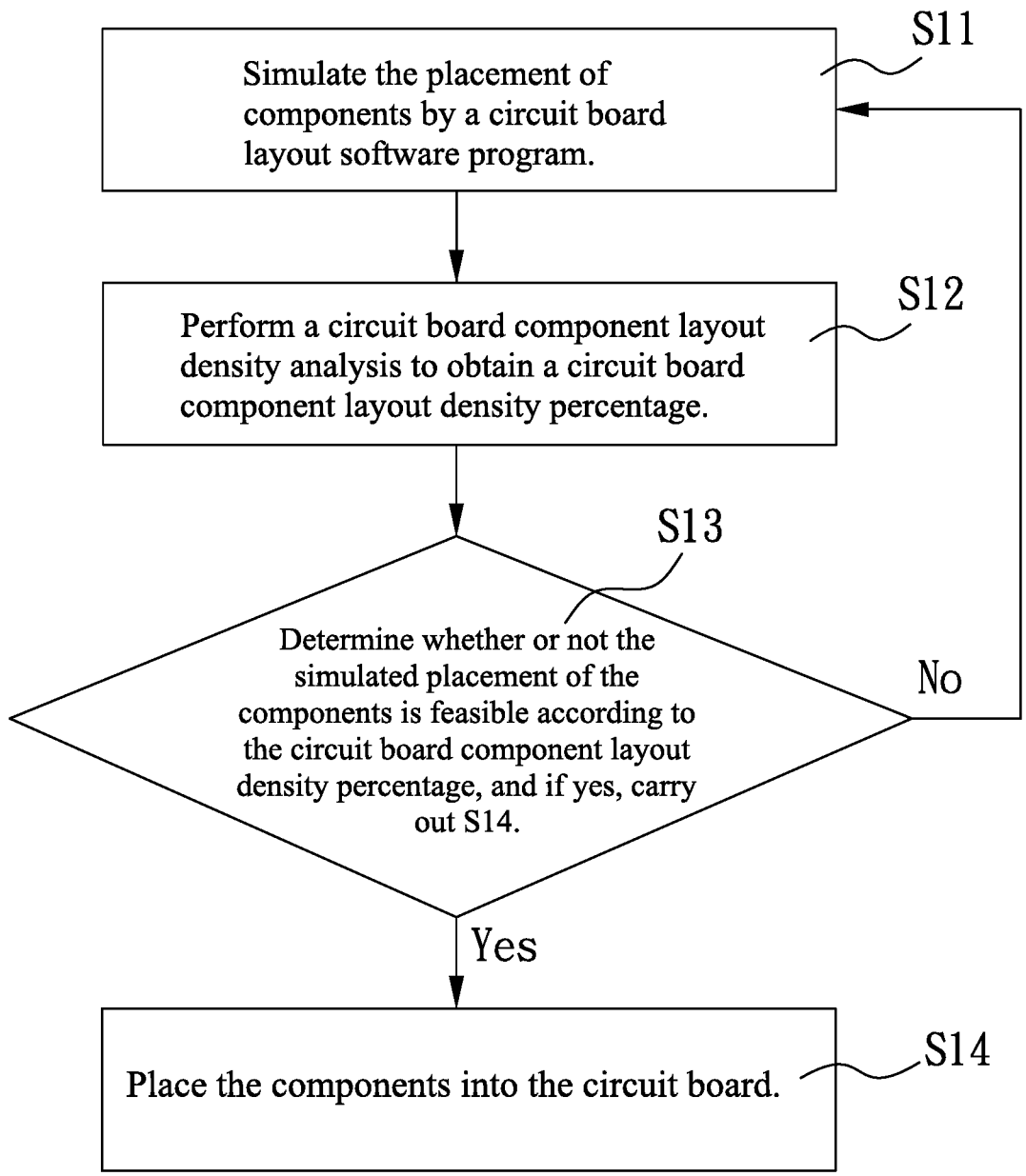

CIRCUIT BOARD COMPONENT LAYOUT DETERMINATION METHOD

FIELD OF THE INVENTION

The present invention relates to a circuit board component layout determination method, and more particularly to the method that analyzes and determines the implementability of a layout of components on a circuit board, so as to improve the control, efficiency and cost-effectiveness of the layout process of the components on the circuit board.

BACKGROUND OF THE INVENTION

1. Description of the Related Art

During the development of an electronic product, a component layout engineer generally uses a layout software program to complete a simulated placement of components on a circuit board, and then performs the actual placement of the components on the circuit board. However, such procedure usually takes one to two weeks before the engineer knows whether or not all components can be arranged into the circuit board. Obviously, the control of timing is not good enough. Since the development of an electronic product involves a number of market factors, the time to market is quite limited. To cope with the time control and efficiency of the product development, it is necessary to improve the layout procedure and method for circuit board components to overcome the aforementioned drawbacks.

In view of the drawbacks of the prior art that fails to quickly determine whether or not the layout of components on a circuit board is feasible and results in a poor circuit board component layout or design, the inventor of the present invention conducted extensive research to develop a circuit board component layout determination method with good control, efficiency and cost-effectiveness to overcome the drawbacks of the prior art.

2. Summary of the Invention

Therefore, it is a primary objective of the present invention to provide a circuit board component layout determination method that uses a circuit board layout software program and a spreadsheet or a database to calculate the statistics of an area of a circuit board that can be laid and an area of the circuit board that cannot be laid, so as to analyze and determine the implementability of a component layout, and improve the control, efficiency and cost-effective of the component layout of the circuit board.

Another objective of the present invention is to provide a circuit board component layout determination method capable of evaluating the relative area and space for the layout of the circuit board and components before the actual component layout of the circuit board, so as to cope with the fine and compact design on the area and volume of the conventional motherboards and products.

To achieve the aforementioned and other objectives, the present invention discloses a circuit board component layout determination method comprising the following steps:

(1) A circuit board layout software program is provided to simulate the placement of components.

(2) Perform a layout density analysis of the components of a circuit board to obtain a circuit board component layout density percentage.

(3) Determine whether or not the simulated placement of the component is feasible according to the circuit board component layout density percentage; if yes, carry out the step (4).

(4) Place the components into the circuit board.

Wherein, the Step (2) calculates an area of the circuit board that can be laid for all components intended to be laid on the circuit board, and calculates the total occupied area of all components installed on the circuit board under a normal operation, and uses the total occupied area of the components as a numerator and the area of the circuit board that can be laid as a denominator to obtain the circuit board component layout density percentage.

In the aforementioned method, the total occupied area of the installed components is calculated by inputting the type and quantity of all of the installed components into a spreadsheet or a database one by one, or importing the type and quantity of all of the installed components into the spreadsheet or the database, and the component occupied area of all components of the circuit board being created in the spreadsheet or the database in advance, so as to obtain each component occupied area of the component corresponsive to the type and quantity for all components of the circuit board and summing up the component occupied areas of all installed components of the circuit board.

In the aforementioned method, the area of the circuit board that can be laid is calculated by subtracting the area of the circuit board that cannot be laid from the circuit board area, and the circuit board area is the total area including single side or double sides of the circuit board.

In the aforementioned method, the area of the circuit board that cannot be laid comprises an area formed by a frame periphery prohibited region, a component prohibited region, a production prohibited region and a mechanical diagram prohibited region.

In the aforementioned method, the frame periphery prohibited region includes the following detailed items: the four sides of the circuit board which are regions where the components cannot be installed.

In the aforementioned method, the component prohibited region includes the following detailed items: a goldfinger region, a positioning hole region, a heat sink fixing region, an inductance region, and a back region of a ball grid array (BGA) component.

In the aforementioned method, the production prohibited region includes the following detailed items: a reservation of a working space required while a component insertion is being performed and an I/O port area.

In the aforementioned method, the mechanical diagram prohibited region includes the following detailed item: the CPU back fixing plate region, and the region wherein the installation of a component is prohibited as shown in the circuit board mechanical diagram.

In the aforementioned method, the detailed items that the area of the circuit board that cannot be laid are created into a basic data of a spreadsheet or a database in advance, and if the area of each detailed item is also created in the basic data of the spreadsheet or the database, then when a specification code of the circuit board is inputted into the spreadsheet or the database, the detailed items and the area of the circuit board that cannot be laid can be derived, and if the area of each detailed item has not been created into the basic data of the spreadsheet or the database, then when a specification code of the circuit board is inputted into the spreadsheet or the database, each detailed time of the region of the area of the circuit board that cannot be laid can be derived, and a user just needs to input the area of each detailed item, and after the input of the area of each detailed item is completed, each detailed area is summed up to obtain the area of the circuit board that cannot be laid.

In the aforementioned method, the Step (3) compares the circuit board component layout density percentage with a predetermined density parameter value, and if the circuit board component layout density percentage is small than or equal to the predetermined density parameter value, then the simulated placement of the components will be determined to be feasible.

In the aforementioned method, the Step (3) compares the circuit board component layout density percentage with a predetermined density parameter value, and if the circuit board component layout density percentage is greater than the predetermined density parameter value, then the simulated placement of the components and wiring is not feasible and the method returns to the operation of step (1).

The above and other objects, features and advantages of this disclosure will become apparent from the following detailed description taken with the accompanying drawings.

BRIEF DESCRIPTION OF THE DRAWINGS

The Sole FIGURE is a flow chart of a circuit board component layout determination method of the present invention.

DESCRIPTION OF THE PREFERRED EMBODIMENTS

With reference to the sole FIGURE for the flow chart of a circuit board component layout determination method of the present invention, the method comprises the following steps:

Step 1: Use a circuit board layout software program to simulate the placement of components (S11). In other words, a circuit board layout software program (such as Allegro) is executed to simulate the placement of components for a component layout.

Step 2: Perform a circuit board component layout density analysis to obtain a circuit board component layout density percentage (S12). For all components intended to be installed on a circuit board B, an area of the circuit board that can be laid B1 is calculated, and the total occupied area A1 of all components installed on the circuit board B under a normal operation is calculated, and the total occupied area A1 of the installed components is used as a numerator, and the area of the circuit board that can be laid B1 is used as a denominator to obtain the circuit board component layout density percentage.

In a circuit board component layout density analysis, the area of a circuit board that can be laid B1 of the circuit board B is obtained by subtracting the area of the circuit board that cannot be laid BX of the circuit board B from the circuit board area B0 of the circuit board B. In other words, Area of the circuit board that can be laid (B1)=Circuit board area (B0)−Area of the circuit board that cannot be laid (BX) and the circuit board area B0 includes the total area of a single side or double sides of the circuit board B.

The area of the circuit board that cannot be laid BX comprises an area formed by a frame periphery prohibited region, a component prohibited region, a production prohibited region and a mechanical diagram prohibited region. The details are described as follows:

(1) The frame periphery prohibited region includes the following detailed items: the four sides of the circuit board are regions where the components cannot be installed. This region is the frame periphery prohibited region.

(2) The component prohibited region includes but not limited to the following detailed items: a goldfinger region, a positioning hole region, a heat sink fixing region, an inductance region (with electromagnetic interference, and thus no component is allowed to be installed on the front or back side of the region), and a back region of a ball grid array (BGA) component. The component prohibited region is a region already having built-in components and functional regions, so that an additional component cannot be placed into this region.

(3) The production prohibited region includes the following detailed items: a reservation of a working space is required while a component insertion is being performed, and an I/O port area.

(4) The mechanical diagram prohibited region includes but not limited to the following detailed items: and the region wherein the installation of a component is prohibited as shown in the circuit board mechanical diagram.

Wherein, the area BX of the circuit board B that cannot be laid includes the detailed item: the area of the circuit board that cannot be laid is created into basic data of a spreadsheet or a database in advance, and if the area of each detailed item is also created in the basic data of the spreadsheet or the database, then when a specification code of the circuit board is inputted into the spreadsheet or the database, the area of the circuit board that cannot be laid including the detailed item and the area of each detailed item can be derived, and if the area of each detailed item has not been created into the basic data of the spreadsheet or the database, then when a specification code of the circuit board is inputted into the spreadsheet or the database, each detailed time of the region of the area of the circuit board that cannot be laid can be derived, and a user just needs to input the area of each detailed item, and after the input of the area of each detailed item is completed, each detailed area is summed up to obtain the area of the circuit board that cannot be laid.

The total occupied area A1 of all components A occupied on the circuit board B at normal operation is calculated by inputting the type and quantity of all of the installed components into a spreadsheet or a database one by one, or importing the type and quantity of all of the installed components into the spreadsheet or the database by the circuit board layout software (such as Allegro), and the component occupied area of all components of the circuit board being created in the spreadsheet or the database in advance, so as to obtain the total occupied area A1 of each of the components corresponsive to the type and quantity for all components of the circuit board and summing up the component occupied areas of all installed components of the circuit board.

In the following computation, a circuit board component layout density analysis is performed to obtain the circuit board component layout density percentage C %, wherein total occupied area A1 of the installed components (numerator) is divided by the area of the circuit board that can be laid B1 (denominator), or the total occupied area A1 of the installed components/the area of the circuit board that can be laid B1 to obtain the circuit board component layout density percentage, which is represented by the equation $A1/B1 \times 100\% = C\%$. For example, the circuit board component layout density percentage is 70%, 80%, 95%, etc. Now, the circuit board component layout density percentage (the value of C) is 70, 80, 95, etc.

In the Step 3, the feasibility of the simulated placement of components is determined according to the circuit board component layout density percentage (S13). In other words, the circuit board component layout density percentage (the value of C) is compared with a predetermined density parameter value D % (the value of D), and the predetermined density parameter value D % (the value of D) may be set according to actual required conditions (by users). If the circuit board component layout density percentage is small than or equal to the predetermined density parameter value (C≤D), such as the value of C is 70 or 80, and the predetermined density parameter value (the value of D) is 80, or C≤D (70/80≤80), then the method will determine that the simulated placement of components and wiring is feasible, and then the operation of the step 4 will be carried out. If the circuit board component layout density percentage is greater than the predetermined density parameter value (C>D), such as the value of C is 90, and the predetermined density parameter value (the value of D) is 80, or C>D (90>80), then the method will determine that the simulated placement of components and wiring is not feasible, and will return to Step 1 to carry out the operation of "simulating the placement of components by a circuit board layout software program (S11)".

Step 4: The components are placed into the circuit board (S14). As described in the aforementioned Step 3, if the circuit board component layout density percentage is small than or equal to the predetermined density parameter value (C≤D), then the components can actually be laid on the circuit board B to complete the layout of the related electronic components/elements on the circuit board.

In circuit board component layout determination method of the present invention, a circuit board layout software program and a spreadsheet or database are used to count the area of the circuit board that can be laid (B1) and the area of the circuit board that cannot be laid (BX) and analyze and determine the implementability of the component layout to improve the control, efficiency and cost-effectiveness of the component layout of the circuit board. In addition, the present invention can evaluate the relative area and space for the layout of the circuit board and components before the actual component layout of the circuit board, so as to cope with the fine and compact design on the area and volume of the conventional motherboards and products.

While the invention has been described by means of specific embodiments, numerous modifications and variations could be made thereto by those skilled in the art without departing from the scope and spirit of the invention set forth in the claims. In addition, the present invention complies with patent application requirements, and is thus duly filed for patent application.

What is claimed is:

1. A circuit board component layout determination method, comprising the steps of:
   (1) deciding a circuit board specification, and quantity and specification of all components to be placed on the circuit board;
   (2) calculating a total area occupied by the components to be placed on the circuit board under a normal operation, and calculating a layout area of the circuit board, wherein the layout area of the circuit board is obtained by subtracting the area of the circuit board that cannot be laid from the circuit board area of the circuit board;
   (3) analyzing layout density of circuit board components to obtain a layout density percentage of the circuit board components;
   (4) determining whether or not the placement of the components is feasible according to the density percentage of the circuit board components, and if yes, carrying out the step (5), if not, returning to the step (1); and
   (5) proceed to formally place the components onto the circuit board,
   wherein the step (3) calculates an area of the circuit board that can be laid for all components intended to be laid on the circuit board, and calculates the total occupied area of all components installed on the circuit board under a normal operation, and uses the total occupied area of the components as a numerator and the area of the circuit board that can be laid as a denominator to obtain the circuit board component layout density percentage.

2. The circuit board component layout determination method of claim 1, wherein the circuit board area is the total area including single side or double sides of the circuit board.

3. The circuit board component layout determination method of claim 1, wherein the area of the circuit board that cannot be laid comprises an area formed by a frame periphery prohibited region, a component prohibited region, a production prohibited region and a mechanical diagram prohibited region.

4. The circuit board component layout determination method of claim 3, wherein the frame periphery prohibited region includes the following detailed items: the four sides of the circuit board are regions where the components cannot be installed.

5. The circuit board component layout determination method of claim 4, wherein the component prohibited region includes the following detailed items: a goldfinger region, a positioning hole region, a heat sink fixing region, an inductance region, and a back region of a ball grid array (BGA) component.

6. The circuit board component layout determination method of claim 5, wherein the production prohibited region includes the following detailed items: a reservation of a working space required while a component insertion is being performed and an I/O port area.

7. The circuit board component layout determination method of claim 6, wherein the mechanical diagram prohibited region includes the following detailed items: a CPU back fixing plate region, and a region where the installation of a component is prohibited as shown in a circuit board mechanical diagram.

8. The circuit board component layout determination method of claim 1, wherein the step (4) compares the circuit board component layout density percentage with a predetermined density parameter value, and if the circuit board component layout density percentage is smaller than or equal to the predetermined density parameter value, then the simulated placement of the components will be determined to be feasible.

9. The circuit board component layout determination method of claim 1, wherein the step (4) compares the circuit board component layout density percentage with a predetermined density parameter value, and if the circuit board component layout density percentage is greater than the predetermined density parameter value, then the simulated placement of the components and wiring is not feasible and the method returns to the operation of the step (1).

* * * * *